(12) United States Patent
Wang et al.

(10) Patent No.: US 11,362,760 B2
(45) Date of Patent: *Jun. 14, 2022

(54) POLAR CODE RATE MATCHING METHOD AND APPARATUS

(71) Applicant: HUAWEI TECHNOLOGIES CO., LTD., Guangdong (CN)

(72) Inventors: Jian Wang, Hangzhou (CN); Lingchen Huang, Hangzhou (CN); Yunfei Qiao, Hangzhou (CN); Rong Li, Hangzhou (CN)

(73) Assignee: Huawei Technologies Co., Ltd., Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 17/189,834

(22) Filed: Mar. 2, 2021

(65) Prior Publication Data

US 2021/0184786 A1 Jun. 17, 2021

Related U.S. Application Data

(63) Continuation of application No. 16/822,712, filed on Mar. 18, 2020, now Pat. No. 10,958,374, which is a (Continued)

(30) Foreign Application Priority Data

Sep. 18, 2017 (CN) .......................... 201710843301.4

(51) Int. Cl.
*H04L 27/00* (2006.01)
*H04L 1/00* (2006.01)

(52) U.S. Cl.
CPC .......... *H04L 1/0013* (2013.01); *H04L 1/0057* (2013.01)

(58) Field of Classification Search
CPC ........................... H04L 1/0013; H04L 1/0057
(Continued)

(56) References Cited

U.S. PATENT DOCUMENTS

2015/0156242 A1 6/2015 Hwang et al.
2016/0352464 A1* 12/2016 Shen ..................... H03M 13/13

FOREIGN PATENT DOCUMENTS

CN 105811998 7/2016
CN 106817195 6/2017
(Continued)

OTHER PUBLICATIONS

Ericsson, "Performance of Rate matching Schemes for Polar Codes" 3GPP TSG RAN WG1 Meeting #90, R1-1712647, Prague, Czech Republic, Aug. 21-25, 2017, 6 pages.

(Continued)

*Primary Examiner* — Zewdu A Kassa
(74) *Attorney, Agent, or Firm* — Fish & Richardson P.C.

(57) ABSTRACT

Example Polar code rate matching methods and apparatus are described. One example method includes determining indexes of Z polarized channels on which forced frozen bits are placed, where the Z polarized channels are a subset of N polarized channels corresponding to N to-be-encoded bits, where $N=2^n$, $Z<N$, and n and Z are positive integers. A first codeword with a length of N is obtained by performing Polar coding on the N to-be-encoded bits. Rate matching is performed on the first codeword to obtain a second codeword with a length of M, where $M<N$ and M is a positive integer. The second codeword with a length of M is sent.

20 Claims, 7 Drawing Sheets

Related U.S. Application Data continuation of application No. PCT/CN2018/106299, filed on Sep. 18, 2018.

(58) Field of Classification Search
USPC .......................................... 375/295, 316, 219
See application file for complete search history.

(56) References Cited

FOREIGN PATENT DOCUMENTS

| | | |
|---|---|---|
| CN | 107124188 | 9/2017 |
| WO | 2015139297 | 9/2015 |
| WO | 2016082142 | 6/2016 |
| WO | 2017092543 | 6/2017 |
| WO | 2017097098 | 6/2017 |
| WO | 2017101631 | 6/2017 |
| WO | 2018127198 | 7/2018 |

OTHER PUBLICATIONS

Ericsson,"Rate Matching Schemes for Polar Codes",3GPP TSG-RAN WG1#88bis, R1-170317, Spokane, U.S., Apr. 3-7, 2017, 6 pages.

Extended European Search Report issued in European Application No. 18856028.8 dated Aug. 7, 2020, 8 pages.

MediaTek Inc., "Polar rate-matching design and performance" 3GPP TSG RAN WG1 RAN1 Meeting #90, R1-1713705, Prague, Czech, Aug. 21-25, 2017, 7 pages.

MediaTek Inc.,"Polar Code Size and Rate-Matching Design for NR Control Channels", 3GPP TSG RAN WG1 RAN1 #88 Meeting, R1-1702735, Athens, Greece, Feb. 13-17, 2017, 8 pages.

Office Action issued in Chinese Application No. 201710843301.4 dated Dec. 26, 2019, 12 pages (With English Translation).

PCT International Search Report and Written Opinion in International Application No. PCT/CN2018/106,299, dated Nov. 28, 2018, 15 pages (With English Translation).

Qualcomm Incorporated, "A comprehensive rate-matching scheme for polar codes and performance evaluation",3GPP TSG-RAN WG1 #88b, R1-1705634, Spokane, USA, Apr. 3-7, 2017, 9 pages.

Qualcomm Incorporated,"Rate-matching scheme for control channel",3GPP TSG-RAN WG1 RAN1, R1-1713470, Prague, CZ, Aug. 21-25, 2017, 9 pages.

Samsung,"Circular Buffer Management for Polar Code Rate-Matching",3GPP TSG RAN WG1 NR Ad-Hoc#2, R1-1710751, Qingdao, P.R. China, Jun. 27-30, 2017, 4 pages.

ZTE et al.,"Rate Matching of Polar Codes for eMBB",3GPP TSG RAN WG1 Meeting#88bis, R1-1704385,Spokane, USA, Apr. 3-7, 2017, 12 pages.

* cited by examiner

POLAR CODE RATE MATCHING METHOD AND APPARATUS

CROSS-REFERENCE TO RELATED APPLICATIONS

This application is a continuation of U.S. patent application Ser. No. 16/822,712, filed on Mar. 18, 2020, which is a continuation of International Application No. PCT/CN2018/106299, filed on Sep. 18, 2018. The International Application claims priority to Chinese Patent Application No. 201710843301.4, filed on Sep. 18, 2017. All of the aforementioned patent applications are hereby incorporated by reference in their entireties.

TECHNICAL FIELD

This application relates to the field of channel coding, and more specifically, to a Polar code rate matching method and apparatus.

BACKGROUND

A communications system usually performs channel coding to improve data transmission reliability and ensure communication quality. A polar code (Polar code) is a first code that is theoretically proved to be capable of achieving a Shannon capacity and has low encoding and decoding complexity, and therefore is widely used.

When a Polar code is used to perform channel coding, according to a Polar coding principle, lengths of codewords obtained after Polar coding is performed on to-be-encoded bits are each an integral power of 2. When a length of a codeword that can be actually transmitted on a channel is not an integral power of 2, rate matching needs to be performed on the codeword, to obtain a codeword of a required length, and then the codeword is transmitted on the channel. Usually, a to-be-encoded bit space before encoding may be referred to as a U domain, and a codeword space after encoding may be referred to as an X domain.

A conventional rate matching solution includes two manners: shortening and puncturing. In either the shortening or the puncturing manner, a shortened location or a punctured location is first determined in the X domain, then a sub-channel on which a forced frozen bit is placed is determined in the U domain based on the shortened location or the punctured location, and finally, an information bit set and a fixed bit set are selected. However, when the shortened location or the punctured location is determined in the X domain, a large quantity of shortened locations or punctured locations usually need to be searched, and through comparison between performance obtained by performing rate matching at these shortened locations or punctured locations, a shortened location or a punctured location at which better performance is obtained is used as the shortened location or the punctured location selected for the X domain. It is found through practice that, when a shortened location or a punctured location is searched for in the X domain, search space is relatively large, and performance obtained by performing rate matching at a plurality of different shortened locations or punctured locations may be basically equivalent; and consequently search efficiency is relatively low.

SUMMARY

Embodiments of this application provide a Polar code rate matching method and apparatus, to reduce the search space of a codeword field when a Polar code rate matching solution is selected, and improve the search efficiency.

According to a first aspect, this application provides a Polar code rate matching method, including:

determining a first index set corresponding to N to-be-encoded bits, wherein the first index set comprises indexes of Z polarized channels on which forced frozen bits are placed, the Z polarized channels are a subset of N polarized channels corresponding to the N to-be-encoded bits, $N=2^n$, $Z<N$, and n and Z are positive integers; obtaining a first codeword with a length of N, wherein the first codeword is obtained by performing Polar coding on the N to-be-encoded bits; performing rate matching on the first codeword based on the first index set, to obtain a second codeword with a length of M, wherein $M<N$ and M is a positive integer; and sending the second codeword with a length of M.

It can be understood that, a key issue of Polar encoding is to select an information bit index set and a frozen bit index set. Selection of an information bit index set and a frozen bit index set is performed based on reliability of polarized channels. In the embodiment of this application, sub-channels, on which the forced frozen bits are placed, are subtracted from N sub-channels corresponding to N to-be-encoded bits. From the rest of the sub-channels of the N sub-channels, K sub-channels with the highest reliability are selected to carry information bits, and remaining sub-channels are used to carry frozen bits.

In the embodiment of this application, the encoder side first determines, in a U domain, a set of indexes (that is, the first index set) of sub-channels on which the forced frozen bits are placed, and then determines a shortened location or a punctured location in an X domain based on the first index set to perform rate matching, so that a search space of a codeword field can be reduced when a Polar code rate matching solution is selected.

In a possible design, the performing rate matching on the first codeword based on the first index set comprises: determining at least one second index set based on the first index set, wherein each second index set comprises a determined index of a punctured location or a shortened location in the first codeword; and performing rate matching on the first codeword based on any second index set of the at least one second index set.

In a possible design, the determining at least one second index set based on the first index set comprises: reading, from N indexes corresponding to the first codeword, an index the same as an index in the first index set, to obtain one second index set.

In a possible design, the determining at least one second index set based on the first index set comprises: determining a first bit sequence based on the first index set, wherein a length of the first bit sequence is equal to N; performing bit exchange processing on the first bit sequence, to obtain at least one second bit sequence, wherein the bit exchange processing is to exchange, in the first bit sequence, a bit placed at a location indicated by an ith index with a bit placed at a location indicated by an (N/2+i)th index, i traverses $\{0, 1, \ldots, N/2-1\}$, and the at least one second bit sequence is different from each other; and reading, from each second bit sequence of the at least one second bit sequence, an index of a location at which a bit 0 is placed, to obtain the at least one second index set, wherein each second bit sequence corresponds to one second index set.

In a possible design, an index of a location, in the first bit sequence, at which a bit 0 is placed is the same as an index in the first index set.

In a possible design, the determining a first bit sequence based on the first index set comprises: determining a third bit sequence based on the first index set, wherein an index of a location, in the third bit sequence, at which a bit 0 is placed is the same as an index in the first index set; and inverting the third bit sequence, to obtain the first bit sequence.

In a possible design, the performing rate matching on the first codeword based on any second index set of the at least one second index set comprises: using a location indicated, in the first codeword, by an index in the any second index set, as the shortened location or the punctured location of the first codeword, and performing rate matching on the first codeword.

According to a second aspect, this application provides a Polar code rate matching apparatus, comprising:

a processing unit, configured to determine a first index set corresponding to N to-be-encoded bits, wherein the first index set comprises indexes of Z polarized channels on which forced frozen bits are placed, the Z polarized channels are a subset of N polarized channels corresponding to the N to-be-encoded bits, N=2n, Z<N, and n and Z are positive integers, wherein the processing unit is further configured to obtain a first codeword with a length of N, wherein the first codeword is obtained by performing Polar coding on the N to-be-encoded bits; and the processing unit is further configured to perform rate matching on the first codeword based on the first index set, to obtain a second codeword with a length of M, wherein M<N and M is a positive integer; and a sending unit, configured to send the second codeword with a length of M.

In a possible design, the processing unit is specifically configured to: determine at least one second index set based on the first index set, wherein each second index set comprises a determined index of a punctured location or a shortened location in the first codeword; and perform rate matching on the first codeword based on any second index set of the at least one second index set.

In a possible design, the processing unit is specifically configured to read, from N indexes corresponding to the first codeword, an index the same as an index in the first index set, to obtain one second index set.

In a possible design, the processing unit is specifically configured to: determine a first bit sequence based on the first index set, wherein a length of the first bit sequence is equal to N; perform bit exchange processing on the first bit sequence, to obtain at least one second bit sequence, wherein the bit exchange processing is to exchange, in the first bit sequence, a bit placed at a location indicated by an ith index with a bit placed at a location indicated by an (N/2+i)th index, i traverses {0, 1, . . . , N/2−1}, and the at least one second bit sequence is different from each other; and read, from each second bit sequence of the at least one second bit sequence, an index of a location at which a bit 0 is placed, to obtain the at least one second index set, wherein each second bit sequence corresponds to one second index set.

In a possible design, an index of a location, in the first bit sequence, at which a bit 0 is placed is the same as an index in the first index set.

In a possible design, the processing unit is specifically configured to: determine a third bit sequence based on the first index set, wherein an index of a location, in the third bit sequence, at which a bit 0 is placed is the same as an index in the first index set; and invert the third bit sequence, to obtain the first bit sequence.

In a possible design, the processing unit is specifically configured to: use a location indicated, in the first codeword, by an index in the any second index set, as the shortened location or the punctured location of the first codeword, and perform rate matching on the first codeword, to obtain the second codeword.

According to a third aspect, this application provides a Polar code rate matching device, comprising: one or more processors, one or more memories and one or more transceivers (each transceiver includes a transmitter and a receiver). The transmitter or the receiver transmits or receives a signal by using an antenna. The memory is configured to store a computer program instruction (in other words, code). The processor is configured to execute the instruction stored in the memory, and when the instruction is executed, the processor performs the method provided in any one of the first aspect or the possible designs of the first aspect.

According to a fourth aspect, this application provides a readable storage medium, including a readable storage medium and a computer program. The computer program is used to implement the rate matching method provided in any one of the first aspect or the possible designs of the first aspect.

According to a fifth aspect, this application provides a chip (or a chip system), including a memory and a processor. The memory is configured to store a computer program, and the processor is configured to invoke the computer program from the memory and run the computer program, so that a communications device in which the chip is installed is enabled to perform the method provided in any one of the first aspect or the possible designs of the first aspect.

According to a sixth aspect, this application provides a computer program product. The computer program product includes computer program code, and when the computer program code is run on a computer, the computer is enabled to perform the method provided in any one of the first aspect or the possible designs of the first aspect.

According to a seventh aspect, this application provides an encoding apparatus. The encoding apparatus has a function for implementing the method provided in any one of the first aspect or the possible designs of the first aspect. The function may be implemented by hardware, or implemented by hardware executing corresponding software. The hardware or the software includes one or more modules corresponding to the foregoing function.

In the embodiment of this application, the encoder side first determines, in a U domain, a set of indexes (that is, the first index set) of sub-channels on which the forced frozen bits are placed, and then determines a shortened location or a punctured location in an X domain based on the first index set to perform rate matching, so that a search space of a codeword field can be reduced when a Polar code rate matching solution is selected.

DESCRIPTION OF EMBODIMENTS

The following describes technical solutions of this application with reference to accompanying drawings.

Figure 1:
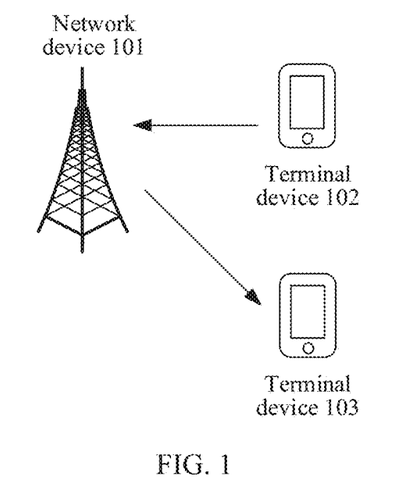
FIG. 1 is a schematic structural diagram of a wireless communications system to which an embodiment of this application is applied.

FIG. 1 is a schematic structural diagram of a wireless communications system to which an embodiment of this application is applied. The wireless communications system may include at least one network device, and the network device communicates with one or more terminal devices. The network device may be a base station, or may be a device integrating a base station and a base station controller, or may be another device having a similar communication function.

The wireless communications system mentioned in this embodiment of this application includes but is not limited to: a narrowband internet of things (narrow band-internet of things, NB-IoT) system, a global system for mobile communications (global system for mobile communications, GSM), an enhanced data rates for GSM evolution (enhanced data rate for GSM evolution, EDGE) system, a wideband code division multiple access (wideband code division multiple access, WCDMA) system, a code division multiple access 2000 (code division multiple access, CDMA2000) system, a time division-synchronous code division multiple access (time division-synchronization code division multiple access, TD-SCDMA) system, a long term evolution (long term evolution, LTE) system, three major application scenarios of next generation 5G mobile communications system, namely, enhanced mobile broadband (enhanced mobile broadband, eMBB), ultra-reliable low-latency communication (ultra reliable low latency communication, URLLC) and enhanced massive machine connection communication (massive machine type communication, eMTC), or a new communications system that emerges in the future.

The terminal device in this embodiment of this application may include various handheld devices, vehicle-mounted devices, wearable devices, or computing devices that have a wireless communication function, or other processing devices connected to a wireless modem. The terminal may be a mobile station (mobile station, MS), a subscriber unit (subscriber unit), a cellular phone (cellular phone), a smartphone (smart phone), a wireless data card, a personal digital assistant (personal digital assistant, PDA) computer, a tablet computer, a wireless modem (modem), a handset (handset), a laptop computer (laptop computer), a machine type communication (machine type communication, MTC) terminal, or the like.

It should be understood that, in FIG. 1, only an example in which the communications system includes one network device and two terminal devices (for example, a network device 101, a terminal device 102, and a terminal device 103 shown in FIG. 1) is used for description. Clearly, the communications system may further include more network devices or more terminal devices.

The network device and the terminal in FIG. 1 communicate with each other by using a wireless technology. When the network device sends a signal, the network device is an encoder side; and when the network device receives a signal, the network device is a decoder side. This is the same for the terminal device. When the terminal device sends a signal, the terminal device is an encoder side; and when the terminal device receives a signal, the terminal device is a decoder side.

In addition, the encoder side may also be considered as a transmit end, and the decoder side may also be considered as a receive end.

Figure 2:
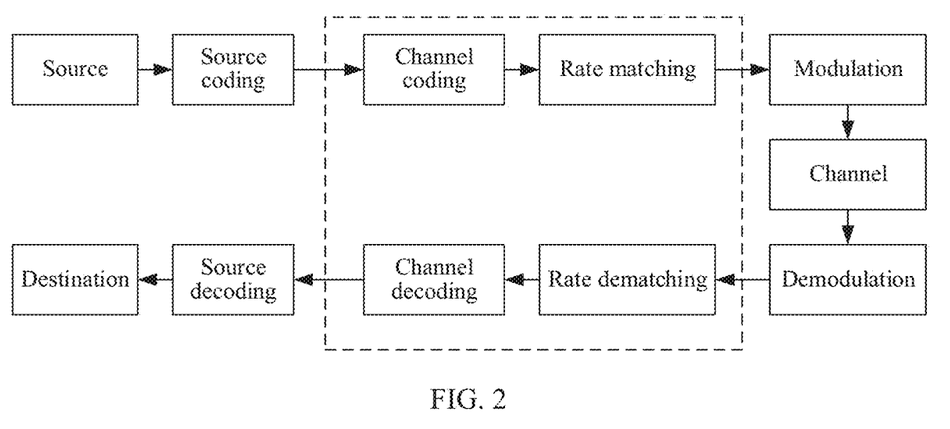
FIG. 2 is a basic flowchart of performing communication by using a wireless technology.

FIG. 2 is a basic flowchart of performing communication by using a wireless technology. A source of a transmit end successively undergoes source coding, channel coding, rate matching, and modulation, and then is sent on a channel. After a receive end receives a signal, the signal undergoes demodulation, rate de-matching, channel decoding, and source decoding, to obtain a destination.

For ease of understanding and description, related concepts in the embodiments of this application are first briefly described.

Channel coding and decoding is one of core technologies in the wireless communications field, and performance improvement of the technology directly enhances network coverage and increases a user transmission rate. Currently, as proved theoretically, Polar coding is a channel coding technology that can reach a Shannon limit and have a practical coding and decoding capability with linear complexity. A core of Polar code construction is to use a coding method on a coding side through "channel polarization" processing, so that sub-channels present different reliability. When a code length continuously increases, some channels tend to be noiseless channels with a capacity close to 1, and the other channels tend to be pure noisy channels with a capacity close to 0. A channel with a capacity close to 1 is selected to directly transmit information, to reach channel capacity as far as possible.

A Polar code coding policy applies a characteristic of such a phenomenon, so that a noiseless channel is used to transmit useful information of a user and a pure noisy channel is used to transmit agreed information or no information. The Polar code is a linear block code. A coding matrix (also referred to as a generation matrix) of the Polar code is $G_N$, and a coding process is $x_1^N = \mu_1^N \cdot G_N$. $\mu_1^N = (\mu_1, \mu_2, \ldots, \mu_N)$ is a binary row vector with a length (a code length) of N, and is also referred to as a to-be-encoded vector. $N=2^n$, and n is a positive integer. $x_1^N$ is an encoded mother codeword. $G_N$ is a matrix of N×N, and $G_N = F_2^{\otimes(\log_2 N)}$. $F_2^{\otimes(\log_2 N)}$ is defined as a Kronecker (Kronecker) product of $\log_2 N$ matrices $F_2$.

$$F_2 = \begin{bmatrix} 1 & 0 \\ 1 & 1 \end{bmatrix}.$$

The addition and multiplication operations in the foregoing formulas are all addition and multiplication operations in a binary Galois field.

In the Polar code coding process, some bits in $u_1^N$ are used to carry information, and these bits are referred to as an information bit set. A set of indexes of these bits is denoted as A. Some other bits are set to fixed values that are pre-agreed on by the receive end and the transmit end, and are referred to as a fixed bit set or a frozen bit (frozen bits) set. A set of indexes of these bits is represented by using a complementary set $A^c$ of A. The Polar code coding process is equivalent to $x_1^N = \mu_A F_N(A) \oplus \mu_{A^c} F_N(A^c)$. Herein, $F_N(A)$ is a submatrix in $F_N$ that is obtained by using rows corresponding to the indexes in the set A. $F_N(A^c)$ is a submatrix in $F_N$ that is obtained by using rows corresponding to the indexes in the set $A^C$. $u_A$ is the information bit set in $u_1^N$ and a quantity of information bits is K. $u_{A^c}$ is the fixed bit set in $u_1^N$, a quantity of fixed bits is (N–K), and the fixed bits are known bits. These fixed bits are usually set to 0. However, the fixed bits may be set randomly, provided that a pre-agreement is reached by the receive end and the transmit end. Therefore, Polar code coding output may be simplified into $x_1^N = \mu_A \cdot F_N(A)$. Herein, $u_A$ is the information bit set in $u_1^N$, $u_A$ is a row vector with a length of K, that is, |A|=K, the symbol || represents a quantity of elements in the set, K is a size of an information block, $F_N(A)$ is a submatrix in the matrix $F_N$ that is obtained by using the rows corresponding to the indexes in the set A, and $F_N(A)$ is a matrix of N×N.

A Polar code construction process is a selection process of the set A, and determines Polar code performance. The Polar code construction process is usually: determining, based on a mother code length N, that there are a total of N polarized channels. Reliability of the N polarized channels is obtained, sequence numbers (or indexes) of the first K polarized channels with the highest reliability are used as elements in the set A, and sequence numbers of remaining (N–K) polarized channels are used as elements in the fixed bit sequence number set $A^C$. The set A determines a location of an information bit, and the set $A^C$ determines a location of a fixed bit. Common construction methods include density evolution (density evolution, DE), Gaussian approximation (Gaussian approximation, GA), and the like.

In the Polar code coding process, the mother code length output by an encoder is an integral power of 2. When an actually required length is not an integral power of 2, rate matching needs to be performed on the mother code, to obtain the required code length. A Polar code rate matching method includes shortening (shorten), puncturing (Puncture), and the like.

The following briefly describes a principle of shortening and puncturing.

(1) Shortening

A principle of a shortening operation is as follows: through adjustment on a to-be-encoded vector, some bits in an encoded mother codeword are enabled to be fixed values (usually 0), and other bits in the codeword are not affected as much as possible. In this way, the transmit end may not send these bits that have fixed values (for example, 0), but the receive end may still know values (usually 0) of the bits, to shorten the codeword. Because the receive end knows that shortened bit locations are 0, during rate de-matching, log-likelihood ratios (likelihood rate, LLR) of these locations are padded as positive infinity for decoding.

(2) Puncturing

The principle of puncturing is different from the principle of shortening. As can be learned from the principle of shortening, a bit at a shortened location in the encoded codeword is definitely 0. However, a bit that is punctured in the codeword through puncturing may not be 0. Therefore, when performing rate de-matching, the receive end pads an LLR at a location that needs to be punctured as 0 for decoding.

It should be noted that an LLR is a log-likelihood ratio (likelihood Rate, LLR). In Polar decoding, an LLR represents a logarithm result of a ratio of a probability that a bit is determined as 0 to a probability that the bit is determined as 1.

Therefore, it may be understood that in the shortening manner, because the bits at the shortened locations in an X domain are definitely 0, during rate de-matching, a decoder side pads LLRs at the shortened locations as positive infinity for decoding. However, in the puncturing manner, because bits punctured in the X domain may not be 0, during rate de-matching, the decoder side pads LLRs at punctured locations as 0 for decoding, to indicate that a probability that the bits at the punctured locations are 0 or 1 occupies 50% each.

This application provides a Polar code rate matching method. A location, in a U domain, at which a forced frozen bit is placed is first determined, and then a shortened location or a punctured location in an X domain is determined based on the location, in the U domain, at which the forced frozen bit is placed, so that a search space of a codeword field can be reduced when a Polar code rate matching solution is selected.

Figure 3:
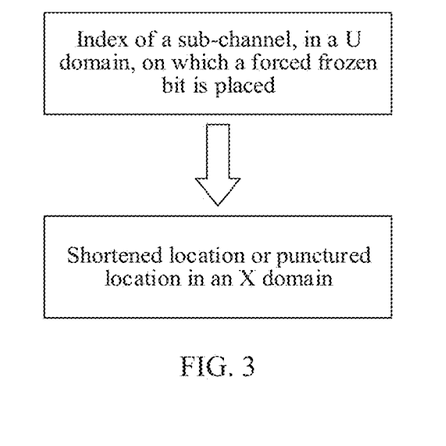
FIG. 3 is a flowchart of a Polar code rate matching method according to an embodiment of this application.

For a rate matching procedure provided in the embodiments of this application, refer to FIG. 3. FIG. 3 is a schematic flowchart of rate matching according to an embodiment of this application.

A Polar code rate matching solution and a Polar code rate de-matching solution in the embodiments of this application are separately implemented in network elements that perform Polar code coding and Polar code decoding. Specifically, for uplink transmission, rate matching is completed by a terminal, and rate de-matching is completed by a base station. On the contrary, for downlink transmission, rate matching is completed by a base station, and rate de-matching is completed by a terminal.

Figure 4:
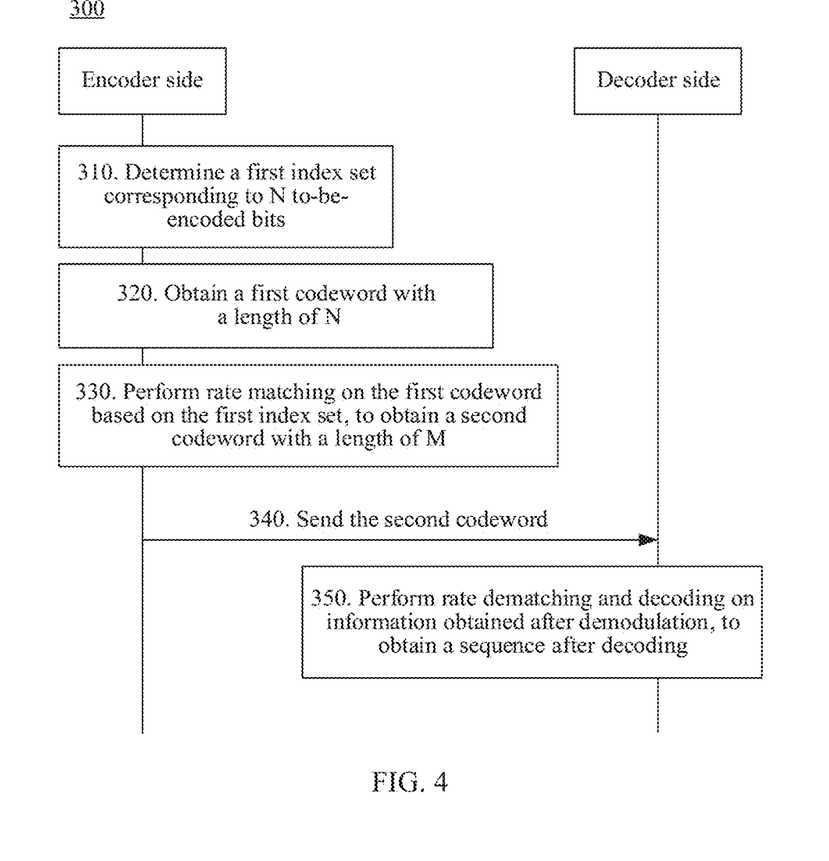
FIG. 4 is a diagram of interaction between an encoder side and a decoder side according to an embodiment of this application.

With reference to FIG. 4, the following describes in detail a Polar code rate matching method according to an embodiment of this application. FIG. 4 is a diagram of interaction between an encoder side and a decoder side according to an embodiment of this application.

310. The encoder side determines a first index set corresponding to N to-be-encoded bits.

The first index set includes indexes of Z polarized channels on which forced frozen bits are placed. The Z polarized channels are a subset of N polarized channels corresponding to the N to-be-encoded bits, $N=2^n$, Z<N, and n and Z are positive integers.

It can be learned from a basic theory of a Polar code that the N to-be-encoded bits correspond to the N polarized channels. The first index set in this embodiment of this application is indexes (or sequence numbers) that are of the Z polarized channels on which the forced frozen bits are placed and that are determined, in the N polarized channels, by the encoder side.

Specifically, regardless of shortening or puncturing, the first index set may be determined in a plurality of manners, for example, bit reversal order or grouping. For example, a mother code length is N=8, a code length after rate matching is 5, and sequence numbers of the polarized channels are {0, 1, 2, . . . , 6, 7}. It can be learned that, to perform rate matching on the mother codeword, three bits need to be removed.

If a puncturing manner in a natural order is used, the first index set is {0, 1, 2}. If a shortening manner in a natural order is used, the first index set is {5, 6, 7}.

If puncturing is performed in a bit reversal order, an operation process is as follows:

expanding {0, 1, 2} into a binary representation with a length of $\log_2(8)=3$, namely, {000, 001, 010}, and inverting the binary representation to obtain {000, 100, 010}, so that a decimal value corresponding to the binary value after the inversion is {0, 4, 2}, in other words, the obtained first index set is {0, 4, 2}.

If a shortening manner in a bit reversal order is used, an operation process is as follows:

expanding {5, 6, 7} into a binary representation with a length of 3, namely, {101, 110, 111}, and inverting the binary representation to obtain {101, 011, 111}, so that a decimal representation of {101, 011, 111} is {5, 3, 7}, in other words, the first index set is {5, 3, 7}.

320. The encoder side obtains a first codeword with a length of N, where the first codeword is obtained by performing Polar coding on the N to-be-encoded bits.

330. The encoder side performs rate matching on the first codeword based on the first index set, to obtain a second codeword with a length of M. M<N, and M is a positive integer greater than 0.

In this embodiment of this application, the encoder side first determines, in a U domain, a set of indexes (that is, the first index set) of sub-channels on which the forced frozen bits are placed, and then determines a shortened location or a punctured location in an X domain based on the first index set to perform rate matching.

340. The encoder side sends the second codeword.

A receive end receives information obtained after demodulation.

It may be understood that when the encoder side sends the second codeword by the encoder side, the encoder side needs to perform processes of modulation and mapping on the second codeword. For the processes of modulation and mapping, refer to the prior art. Details are not described herein.

350. The decoder side performs rate de-matching on the information obtained after demodulation, and decodes a bit sequence obtained after the rate de-matching, to obtain a sequence after decoding.

It should be understood that the decoder side inputs an LLR obtained after demodulation, namely, the information obtained after demodulation herein.

A decoding process of the decoder side is just an inverse process of performing Polar coding and rate matching on the N to-be-encoded bits by the encoder side. Therefore, the decoder side first performs rate de-matching on the information obtained after demodulation, and then decodes a bit sequence obtained after the rate de-matching, to obtain a sequence after decoding.

Steps 310 to 350 shown in FIG. 4 are merely used as an example. Actually, during channel coding and decoding, rate matching performed by the encoder side and rate de-matching performed by the decoder side are based on a same pattern. In other words, the pattern is first determined, after the pattern is determined, the encoder side performs rate matching based on the pattern, and the decoder side performs rate de-matching based on the pattern. Therefore, during rate matching, the encoder side may not need to perform steps 310 and 320. In step 330, the encoder side may directly perform rate matching based on the predetermined pattern. A method for determining the pattern may be a method for determining a second index set that is described in this embodiment of this application. The second index set is determined based on the first index set. How to determine the second index set based on the first index set is described in detail below.

The following describes in detail how to perform rate matching on the first codeword based on the first index set in step 330.

For the shortening manner and the puncturing manner, descriptions are separately provided below.

(1) Shortening Manner

A shortened location in the X domain is determined based on the indexes of the sub-channels, in the U domain, on which the forced frozen bits are placed.

In this embodiment of this application, a set of the indexes of the sub-channels, in the U domain, on which the forced frozen bits are placed is denoted as the first index set, and a set of shortened locations or a set of punctured locations in the X domain is denoted as the second index set.

According to a Polar code coding theory, in the shortening manner, a location, in the U domain, at which a forced frozen bit is placed is the same as a shortened location in the X domain.

Figure 5:
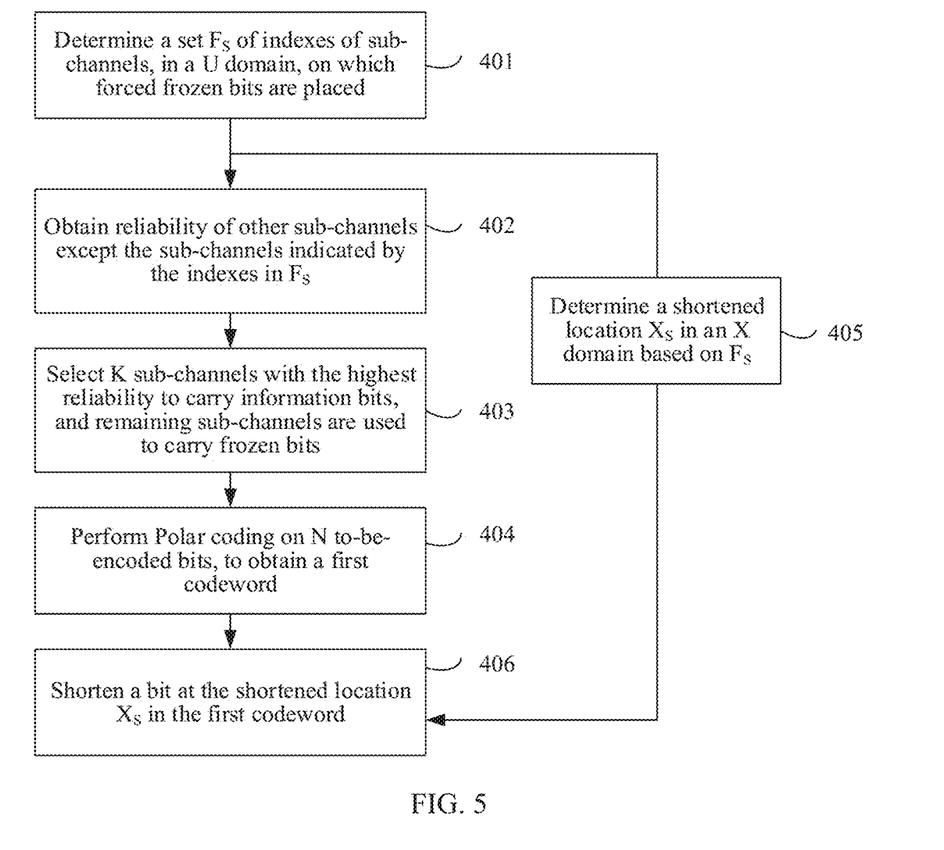
FIG. 5 shows a shortening procedure of a Polar code according to an embodiment of this application.

FIG. 5 shows a Polar code shortening procedure according to an embodiment of this application.

In FIG. 5, a set including indexes of sub-channels, in a U domain, on which forced frozen bits are placed is denoted as $F_S$.

401. An encoder side determines the set $F_S$ of the indexes of the sub-channels, in the U domain, on which the forced frozen bits are placed.

Selection of an index of a sub-channel, in the U domain, on which a forced frozen bit is placed may be based on Polar code performance. However, it can be learned from the Polar code coding theory that a coding result, in an X domain, corresponding to the sub-channel on which the forced frozen bit is placed is definitely 0, and $F_S$ that meets this condition is not unique and may be determined in a plurality of manners, for example, bit reversal order or grouping.

402. The encoder side obtains reliability of other sub-channels except the sub-channels indicated by the indexes in the set $F_S$.

The encoder side may determine the reliability of the other sub-channels in a manner of formula calculation, table lookup, or the like. The other sub-channels described herein are sub-channels in N polarized channels corresponding to N to-be-encoded bits except the sub-channels indicated by the indexes included in $F_S$.

403. The encoder side selects, from the other sub-channels, K sub-channels with the highest reliability to carry information bits, and remaining sub-channels are used to carry frozen bits.

The encoder side selects, from the other sub-channels based on values of reliability of the other sub-channels obtained in step 402, the K polarized channels with the highest reliability to carry the information bits, and the remaining sub-channels are used to carry the frozen bits.

404. The encoder side performs Polar coding on the N to-be-encoded bits, to obtain a first codeword.

It should be understood that a length of a mother codeword (that is, the first codeword) obtained after Polar coding is performed on the to-be-encoded bits is equal to an integral power of 2.

405. The encoder side determines a shortened location Xs in the X domain based on $F_S$ in the U domain.

The shortened location Xs in the X domain is the same as the location, in the U domain, at which the forced frozen bit is placed.

406. The encoder side shortens a bit at the shortened location Xs in the first codeword, to obtain a second codeword with a length of M.

M<N, and M and N are positive integers. It should be noted that the length M of the second codeword obtained after rate matching is no longer limited to a value of an integral power of 2, and a value of M may be any positive integer less than N. For example, N=16, and if $F_S$ includes three elements, M=13. For another example, N=8, and if $F_S$ includes three elements, M=5.

(2) Puncturing Manner

Figure 6:
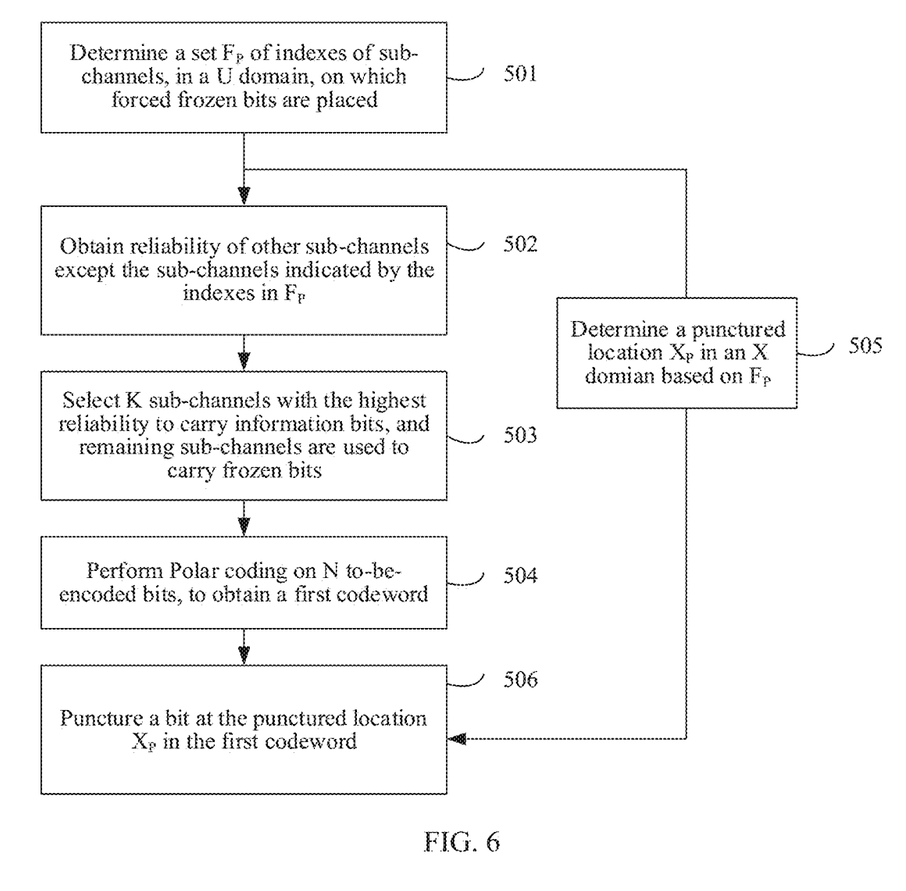
FIG. 6 shows a puncturing procedure of a Polar code according to an embodiment of this application.

FIG. 6 shows a puncturing procedure according to an embodiment of this application.

501. An encoder side determines a set $F_P$ of indexes of sub-channels, in a U domain, on which forced frozen bits are placed.

502. The encoder side obtains reliability of other sub-channels except the sub-channels indicated by the indexes in $F_P$.

503. The encoder side selects, from the other sub-channels, K sub-channels with the highest reliability to carry information bits, and remaining sub-channels are used to carry frozen bits.

504. The encoder side performs Polar coding on N to-be-encoded bits, to obtain a first codeword.

505. The encoder side determines a punctured location XP in an X domain based on $F_P$ in the U domain.

506. The encoder side punctures a bit at the punctured location XP in the first codeword, to obtain a second codeword with a required code length of M.

In the shortening mode, a location, in the U domain, at which a forced frozen bit is placed is the same as the shortened location in the X domain. This is not the same in the puncturing mode. The following describes in detail that in step 505, how to determine the punctured location XP in the X domain based on the set $F_P$ of the indexes of the sub-channels, in the U domain, on which the forced frozen bits are placed.

(1) A first bit sequence is determined based on the set $F_P$ of the indexes of the sub-channels, in the U domain, on which the forced frozen bits are placed.

A bit sequence $F=[f_1, f_2, f_3, \ldots, f_N]$ with a length of N may be obtained based on the set $F_P$ of the indexes of the sub-channels, in the U domain, on which the forced frozen bits are placed. In this bit sequence, a bit 0 is placed at a location indicated by an index in $F_P$, and a bit 1 is placed at another location.

In this embodiment of this application, the first bit sequence may be the bit sequence F with a length of N, or may be a bit sequence obtained after inversion is performed on the bit sequence F.

For ease of description, the bit sequence F is denoted as $P_1$ below, and $P_1=[f_1, f_2, f_3, \ldots, f_N]$. The bit sequence F is inverted, and the obtained bit sequence is denoted as $P_2$, and $P_2=[f_N, f_{N-1}, f_{N-2}, \ldots, f_1]$.

(2) Bit exchange processing is performed on the bit sequence $P_1$ and/or the bit sequence $P_2$, to obtain L second bit sequences.

In this embodiment of this application, the bit exchange processing is to exchange, in a bit sequence, a bit placed at a location indicated by an $i^{th}$ index with a bit placed at a location indicated by an $(N/2+i)^{th}$ index, i traverses $\{0, 1, \ldots, N/2-1\}$, and the L second bit sequences are different from each other.

(3) An index of a location at which a bit 0 is placed is read from each second bit sequence of the L second bit sequences, to obtain at least one second index set, where each second bit sequence corresponds to one second index set.

Subsequently, each second index set may be used as a set of punctured locations in the X domain.

The following uses N=8 and $F_P=\{0, 1, 2\}$ as an example for description.

Based on $F_P=\{0, 1, 2\}$, a bit sequence $F=[f_1, f_2, f_3, \ldots, f_8]$ with a length of N=8 may be obtained. A bit 0 is placed at a location whose index location is 0, 1 or 2 in F, and a bit 1 is placed at other locations. To be specific, F=[0 0 0 1 1 1 1 1]. Therefore, $P_1$=F=[0 0 0 1 1 1 1 1] and $P_2$=[1 1 1 1 1 0 0 0] may be obtained.

In $P_1$, a bit placed at a location indicated by an $i^{th}$ index and a bit placed at a location indicated by an $$\left(\frac{N}{2}+i\right)^{th}$$

index are exchanged, and i traverses $$\left\{0, 1, 2, \ldots, \frac{N}{2}-1\right\}.$$

In this example, a bit at an $i^{th}$ location and a bit at a $(4+i)^{th}$ location in the first bit sequence are exchanged, and i traverses $\{0, 1, 2, 3\}$.

It should be noted herein that, if the bit at the $i^{th}$ location and the bit at the $(4+i)^{th}$ location are referred to as a group of bits for exchange, in the exchange process, one or more groups may be selected for exchange each time, to obtain a second bit sequence.

Bit exchange processing is performed on $P_1$=F=[0 0 0 1 1 1 1 1], to obtain the following eight second bit sequences:
[0 0 0 1 1 1 1 1], [1 0 0 1 0 1 1 1], [0 1 0 1 1 0 1 1], [0 0 1 1 1 1 0 1],
[1 1 0 1 0 0 1 1], [0 1 1 1 1 0 0 1], [1 0 1 1 0 1 0 1], and [1 1 1 1 0 0 0 1].

In addition, bit exchange processing may also be performed on $P_2$=[1 1 1 1 1 0 0 0], and similarly, the following eight second bit sequences may also be obtained:
[1 0 0 0 1 1 1 1], [1 1 0 0 1 0 1 1], [1 0 1 0 1 1 0 1], [1 0 0 1 1 1 1 0],
[1 1 1 0 1 0 0 1], [1 0 1 1 1 1 0 0], [1 1 0 1 1 0 1 0], and [1 1 1 1 1 0 0 0].

Next, an index of a location with a bit value of 0 is read from each second bit sequence, to obtain one second index set. It can be learned that, the plurality of second bit sequences are read, to obtain a plurality of second index sets. In other words, one second index set may be obtained each time one second bit sequence is read.

The eight second bit sequences obtained from Pt are read, to obtain the following eight second index sets: $\{0, 1, 2\}$, $\{1, 2, 4\}$, $\{0, 2, 5\}$, $\{0, 1, 6\}$, $\{2, 4, 5\}$, $\{0, 5, 6\}$, $\{1, 4, 6\}$, and $\{4, 5, 6\}$.

The eight second bit sequences obtained from $P_2$ are read, to obtain the following eight second index sets: $\{1, 2, 3\}$, $\{2, 3, 5\}$, $\{1, 3, 6\}$, $\{1, 2, 7\}$, $\{3, 5, 6\}$, $\{1, 6, 7\}$, $\{2, 5, 7\}$, and $\{5, 6, 7\}$.

One of the foregoing 16 second index sets is randomly selected as a set of punctured locations in the X domain. For example, if $\{0, 1, 2\}$ is selected for rate matching, a location whose index location is 0, 1, or 2 in the first codeword is determined as the punctured location. For another example, if $\{1, 4, 6\}$ is selected for rate matching, a location whose index location is 1, 4, or 6 in the first codeword is determined as the punctured location.

It may be understood that, in a process of performing bit exchange on the bit sequence $P_1$, if the bit at the $i^{th}$ location is the same as the bit at the $$\left(\frac{N}{2}+i\right)^{th}$$

location (both are 0 or 1), a bit sequence obtained after the exchange is the same as $P_1$. In this case, the sequence obtained after the exchange should not be calculated as one of the second bit sequences.

Figure 7:
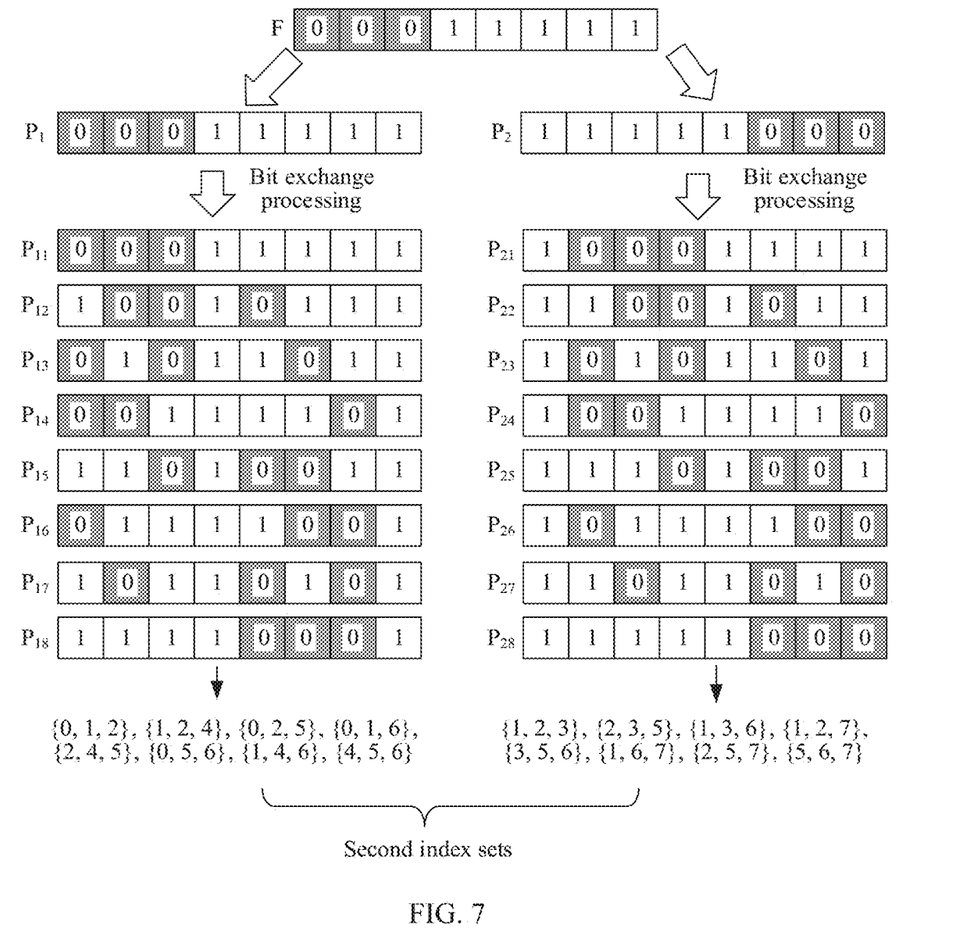
FIG. 7 is a schematic diagram of a bit exchange process.

FIG. 7 is a schematic diagram of a bit exchange process. In FIG. 7, N=8, $F_{P}$>={0, 1, 2}, the bit sequence determined by $F_P$ is F=[0 0 0 1 1 1 1 1], and $P_1$=F=[0 0 0 1 1 1 1 1] and $P_2$=[1 1 1 1 1 0 0 0] are determined based on F.

As shown in FIG. 7, a bit sequence obtained by performing bit exchange processing on $P_1$ includes $P_{11}, P_{12}, \ldots,$ and $P_{18}$, and a bit sequence obtained by performing bit exchange processing on $P_2$ includes $P_{21}, P_{22}, \ldots,$ and $P_{28}$. Indexes of locations, in each of $P_1, P_{12}, \ldots,$ and $P_{18}$, at which a bit 0 is placed are read, to obtain a plurality of second index set. Indexes of locations, in each of $P_{21}, P_{22}, \ldots,$ and $P_{28}$, at which a bit 0 is placed are read, to obtain a plurality of second bit index set.

A second index set is randomly selected from the plurality of second index sets, and an index included in the selected second index set is used as a punctured location for rate matching.

It should be noted that during channel coding, rate matching and rate de-matching are both based on a pattern (pattern). Usually, after the pattern is determined, the encoder side (that is, the transmit end) performs rate matching based on the pattern, and the decoder side (that is, the receive end) performs rate de-matching based on the pattern. The method for determining the second index set described in the embodiments of this application is a method for determining the pattern.

The encoder side performs, based on the pattern, rate matching on the first codeword with a length of N, to obtain a second codeword of a required length (for example, the length is equal to M), where M<N, and M is a positive integer greater than 0.

Subsequently, the encoder side performs modulation and mapping on the second codeword and sends the second codeword to the decoder side.

The decoder side performs rate de-matching based on the same pattern.

The foregoing describes in detail the Polar code rate matching method provided in this application. In the technical solutions of this application, the encoder side first determines the indexes of the sub-channels, in the U domain, on which the forced frozen bits are placed, and then determines the shortened location or the punctured location in the X domain to implement Polar code rate matching, so that rate matching performance can be more directly controlled.

It can be learned from the foregoing described process of determining the punctured location in the X domain that when a punctured location at which better performance is obtained is searched for in the X domain, effects of many puncturing solutions are equivalent. However, by directly selecting the index of the sub-channel, in the U domain, on which the forced frozen bit is placed, a search space can be reduced.

Figure 8:
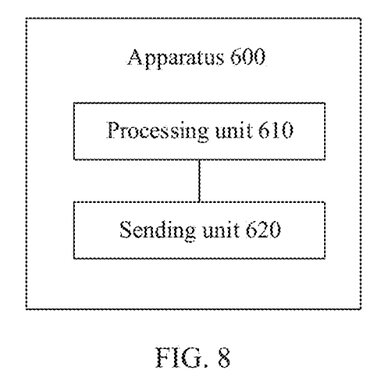
FIG. 8 is a schematic diagram of a Polar code rate matching apparatus 600 according to this application.
Figure 9:
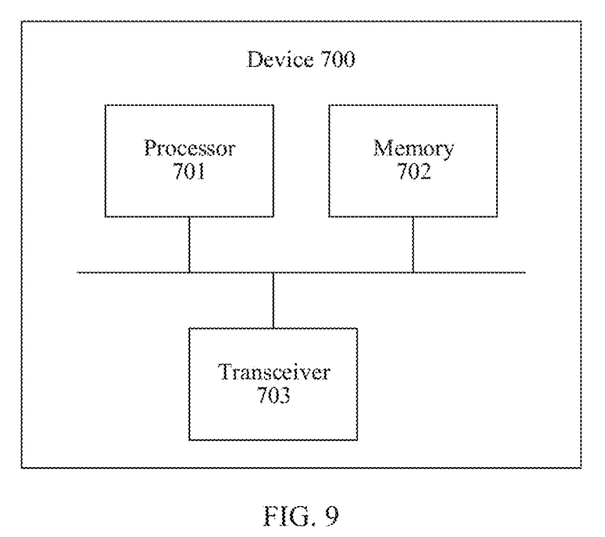
FIG. 9 is a schematic structural diagram of a Polar code rate matching device 700 according to this application.

With reference to FIG. 8 and FIG. 9, the following describes in detail a Polar code rate matching apparatus provided in the embodiments of this application.

FIG. 8 is a schematic diagram of a Polar code rate matching apparatus 600 according to this application. As shown in FIG. 8, the apparatus 600 includes a processing unit 610 and a sending unit 620.

The processing unit 610 is configured to:

determine a first index set corresponding to N to-be-encoded bits, where the first index set includes indexes of Z polarized channels on which forced frozen bits are placed, the Z polarized channels are a subset of N polarized channels corresponding to the N to-be-encoded bits, N=$2^n$, Z<N, and n and Z are positive integers;

obtain a first codeword with a length of N, where the first codeword is obtained by performing Polar coding on the N to-be-encoded bits; and perform rate matching on the first codeword based on the first index set, to obtain a second codeword with a length of M, where M<N and M is a positive integer.

The sending unit 620 is configured to send the second codeword with a length of M.

Further, the processing unit is specifically configured to:

determine at least one second index set based on the first index set, where each second index set includes a determined index of a punctured location or a shortened location in the first codeword; and perform rate matching on the first codeword based on any second index set of the at least one second index set.

The processing unit is specifically configured to read, from N indexes corresponding to the first codeword, an index the same as an index in the first index set, to obtain one second index set.

Further, the processing unit is specifically configured to:

determine a first bit sequence based on the first index set, where a length of the first bit sequence is equal to N;

perform bit exchange processing on the first bit sequence, to obtain at least one second bit sequence, where the bit exchange processing is to exchange, in the first bit sequence, a bit placed at a location indicated by an $i^{th}$ index with a bit placed at a location indicated by an $(N/2+i)^{th}$ index, i traverses {0, 1, ..., N/2−1}, and the at least one second bit sequence is different from each other; and read, from each second bit sequence of the at least one second bit sequence, an index of a location at which a bit 0 is placed, to obtain the at least one second index set, where each second bit sequence corresponds to one second index set.

Further, an index of a location, in the first bit sequence, at which a bit 0 is placed is the same as an index in the first index set.

Further, the processing unit is specifically configured to:

determine a third bit sequence based on the first index set, where an index of a location, in the third bit sequence, at which a bit 0 is placed is the same as an index in the first index set; and invert the third bit sequence, to obtain the first bit sequence.

Further, the processing unit is specifically configured to: use a location indicated, in the first codeword, by an index in any second index set, as the shortened location or the punctured location of the first codeword, and perform rate matching on the first codeword, to obtain the second codeword.

The units in the apparatus 600 in this embodiment of this application and the foregoing other operations or functions are separately intended to implement the Polar code rate matching method in the embodiments of this application. For brevity, details are not described herein again.

In this embodiment of this application, the processing unit first determines, in the U domain, a set of indexes (that is, the first index set) of the sub-channels on which the forced frozen bits are placed, and then the first index set determines the shortened location or the punctured location in the X domain for rate matching, so that a search space of a codeword field can be reduced when a Polar code rate matching solution is selected.

FIG. 9 is a schematic structural diagram of a Polar code rate matching device 700 according to this application. As shown in FIG. 9, the device 700 includes: one or more processors 701, one or more memories 702, and one or more transceivers 703. The processor 701 is configured to control the transceiver 703 to transmit and receive a signal. The memory 702 is configured to store a computer program. The processor 701 is configured to invoke the computer program from the memory 702 and run the computer program, so that the device 700 is enabled to perform a corresponding procedure and/or operation in each embodiment of an rate matching method. For brevity, details are not described herein again.

It should be noted that the apparatus 600 shown in FIG. 8 may be implemented by the device 700 shown in FIG. 9. For example, the processing unit 610 may be implemented by the processor 701, and the sending unit 620 may be implemented by the transceiver 703.

In addition, this application provides a computer-readable storage medium. The computer-readable storage medium stores an instruction, and when the instruction is run on a computer, the computer is enabled to perform the Polar code rate matching method in the foregoing embodiments of this application.

This application further provides a computer program product. The computer program product includes computer program code, and when the computer program code is run on a computer, the computer is enabled to perform the Polar code rate matching method described in any of the foregoing embodiments.

This application further provides a chip (or a chip system), including a memory and a processor. The memory is configured to store a computer program, and the processor is configured to invoke the computer program from the memory and run the computer program, so that a communications device in which the chip is installed is enabled to perform the Polar code rate matching method in the method embodiments of this application.

Herein, the communications device in which the chip is installed may be a device that performs Polar code rate matching. For example, during uplink transmission, a terminal device is equipped with the chip, to perform the rate matching method provided in this application, for example, the terminal device 102 shown in FIG. 1, and the network device 101 performs rate de-matching. During downlink transmission, the network device 101 is equipped with the chip, to perform the rate matching method provided in this application, and the terminal device 103 performs rate de-matching.

This application further provides an encoding apparatus. The encoding apparatus has a function for implementing the Polar code rate matching method in the foregoing embodiments. The function may be implemented by hardware, or implemented by hardware executing corresponding software. The hardware or the software includes one or more modules corresponding to the foregoing function.

Besides, in addition to performing the rate matching method provided in this application, the encoding apparatus may further have other functions for performing processes related to Polar code coding, such as Polar coding and modulation.

It should be understood that, during uplink transmission, the encoding apparatus may be specifically a terminal device, for example, the terminal device 102 shown in FIG. 1. During downlink transmission, the encoding apparatus may be specifically a network device, for example, the network device 101 shown in FIG. 1.

In a possible design, when some or all of the functions are implemented by using hardware, the encoding apparatus includes: an input interface circuit, configured to obtain a first index set and a first codeword; a logic circuit, configured to perform rate matching on the first codeword with a length of N based on the first index set, to obtain a second codeword with a length of M; and an output interface circuit, configured to output the second codeword. M<N, M and N are positive integers, $N=2^n$, and n is an integer greater than 0.

Optionally, the encoding apparatus may be a chip or an integrated circuit.

In a possible design, when some or all of the functions are implemented by using the software, the encoding apparatus includes: a memory, configured to store a program; and a processor, configured to execute the program stored in the memory. When the program is executed, the encoding apparatus may implement the rate matching method in any possible design in the foregoing embodiments.

In a possible design, when some or all of the functions are implemented by the software, the encoding apparatus includes a processor. A memory configured to store a program is located outside the encoding apparatus. The processor is connected to the memory through a circuit/an electric wire, and is configured to read and execute the program stored in the memory.

Optionally, the memory and the processor may be physically independent units, or the memory may be integrated with the processor.

Figure 10:
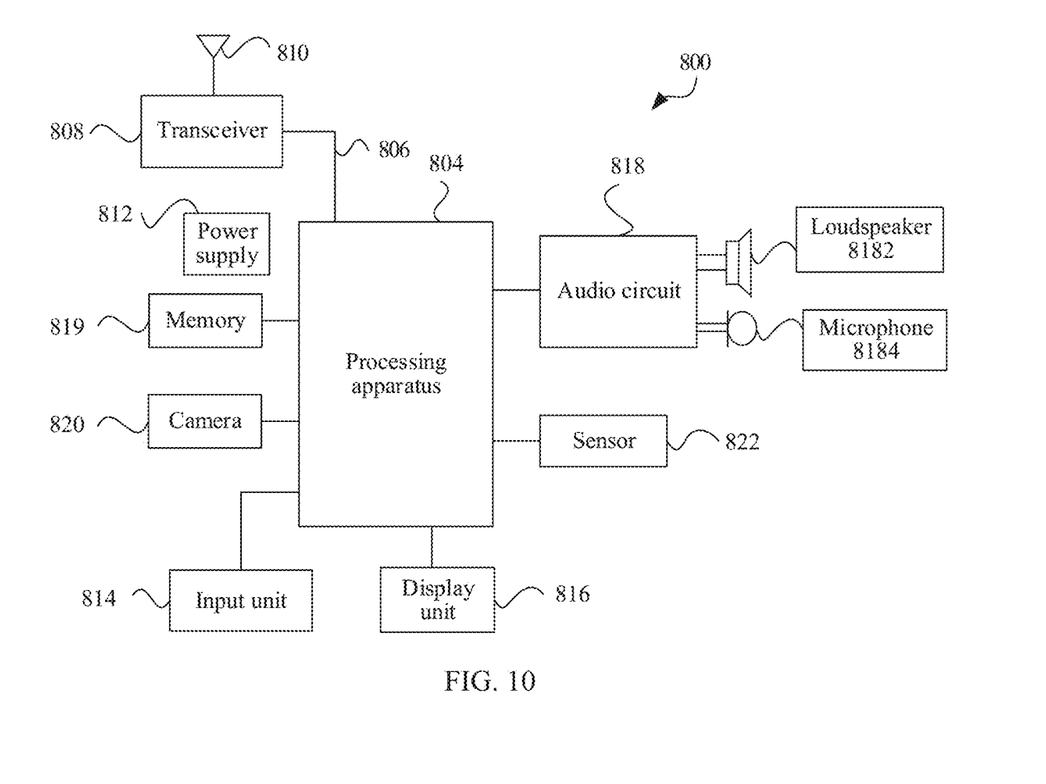
FIG. 10 is a schematic structural diagram of a terminal device 800 according to an embodiment of this application.

In this embodiment of this application, when the apparatus that performs the rate matching method is a terminal device, a structure of the terminal device may be shown in FIG. 10. FIG. 10 is a schematic structural diagram of a terminal device 800 according to an embodiment of this application.

As shown in FIG. 10, the terminal device 800 includes a transceiver 808 and a processor 804. The terminal device 800 may further include a memory 819, and the memory 819 stores a computer-executable instruction.

The processor 804 is configured to: determine a first index set corresponding to N to-be-encoded bits, where the first index set includes indexes of Z polarized channels on which forced frozen bits are placed, the Z polarized channels are a subset of N polarized channels corresponding to the N to-be-encoded bits, $N=2^n$, Z<N, and n and Z are positive integers; obtain a first codeword with a length of N, where the first codeword is obtained by performing Polar coding on the N to-be-encoded bits; and perform rate matching on the first codeword based on the first index set, to obtain a second codeword with a length of M, where M<N and M is a positive integer.

The transceiver 808 is configured to output, based on an instruction of the processor 804, the second codeword with a length of M.

The processor 804 may obtain the first codeword with a length of N by using an internal communications interface of the terminal device.

Further, the processor 804 may be configured to perform an action internally implemented by the rate matching apparatus in the method embodiments, and the transceiver 808 may be configured to perform a receiving action or a sending action in the method embodiments. For details, refer to the descriptions in the foregoing method embodiments. Details are not described herein.

The processor 804 and the memory 819 may be integrated into a processing apparatus. The processor 804 is configured to execute program code stored in the memory 819 to implement the foregoing functions. In specific implementation, the memory 819 may alternatively be integrated into the processor 804.

The terminal device 800 may further include a power supply 812, configured to supply power to various devices or circuits in the terminal device 800. The terminal device 800 may include an antenna 810, configured to send, by using a wireless signal, data or information output by the transceiver 808.

In addition, to improve functions of the terminal device 800, the terminal device 800 may further include one or more of an input unit 814, a display unit 816, an audio circuit 818, a camera 820, a sensor 822, or the like. The audio circuit may further include a loudspeaker 8182, a microphone 8184, and the like.

It should be noted that during channel coding, rate matching and rate de-matching are both based on a pattern (pattern). After the pattern is determined, a transmit end performs rate matching based on the pattern, and a receive end performs rate de-matching based on the pattern.

In the embodiments of this application, the method for determining the second index set is a method for determining the pattern.

Therefore, this application further provides a rate de-matching apparatus, and the apparatus has a function for implementing the rate de-matching method. The function may be implemented by hardware, or may be implemented by hardware executing corresponding software.

In addition, the rate de-matching apparatus may be a chip, and a communications device in which the chip is installed may perform the rate de-matching method. During uplink transmission, the chip may be installed in a network device, so that the network device has a function for implementing the rate de-matching method. In this case, the rate de-matching apparatus may be the network device 101 shown in FIG. 1. During downlink transmission, the chip may be installed in a terminal device, so that the terminal device has a function for implementing the rate de-matching method. In this case, the rate de-matching apparatus may be the terminal device 103 shown in FIG. 1.

In addition, this application provides a rate de-matching device. The device includes one or more processors, one or more memories, and one or more transceivers (each transceiver includes a transmitter and a receiver). The transmitter or the receiver transmits or receives a signal by using an antenna. The memory is configured to store a computer program instruction (in other words, code). The processor is configured to execute the instruction stored in the memory, and when the instruction is executed, the processor performs the rate de-matching method.

This application further provides a chip (or a chip system), including a memory and a processor. The memory is configured to store a computer program, and the processor is configured to invoke the computer program from the memory and run the computer program, so that a communications device in which the chip is installed is enabled to perform the rate de-matching method.

This application provides a computer-readable storage medium. The computer-readable storage medium stores an instruction, and when the instruction is run on a computer, the computer is enabled to perform the rate de-matching method in the foregoing embodiments.

This application further provides a computer program product. The computer program product includes computer program code, and when the computer program code is run on a computer, the computer is enabled to perform the rate de-matching method described in any of the foregoing embodiments.

This application further provides a decoding apparatus. The decoding apparatus has a function for implementing the rate de-matching method in the foregoing embodiments of this application. The function may be implemented by hardware, or implemented by hardware executing corresponding software. In addition, the decoding apparatus further has a related function for implementing Polar code decoding, such as demodulation and decoding.

In the foregoing embodiments, the processor may be a central processing unit (central processing unit, CPU), a microprocessor, an application-specific integrated circuit (application-specific integrated circuit, ASIC), one or more integrated circuits for controlling program execution in the solutions of this application, or the like. For example, the processor may include a digital signal processor device, a microprocessor device, an analog-to-digital converter, and a digital-to-analog converter. The processor may allocate control and signal processing functions of mobile devices between these devices based on respective functions of the devices. In addition, the processor may include functions for operating one or more software programs, and the software programs may be stored in a memory.

The functions of the processor may be implemented by hardware or may be implemented by hardware executing corresponding software. The hardware or the software includes one or more modules corresponding to the foregoing functions.

The memory may be a read-only memory (read-only memory, ROM), another type of static storage device capable of storing static information and instructions, a random access memory (random access memory, RAM), or another type of dynamic storage device capable of storing information and instructions, or the memory may alternatively be an electrically erasable programmable read-only memory (electrically erasable programmable read-only memory, EEPROM), a compact disc read-only memory (compact disc read-only memory, CD-ROM), or another compact disc storage, optical disc storage (which includes a compact disc, a laser disc, an optical disc, a digital versatile disc, a Blu-ray disc, and the like), a magnetic disk storage medium or another magnetic storage device, or any other medium that can be used to carry or store expected program code having an instruction or a data structure form and that can be accessed by a computer. However, this is not limited herein.

With reference to the foregoing descriptions, a person skilled in the art may be aware that, the methods of the embodiments in the specification may be implemented by hardware (for example, a logic circuit), or software, or a combination of hardware and software. Whether the methods are performed by hardware or software depends on particular applications and design constraint conditions of the technical solutions. A person skilled in the art may use different methods to implement the described functions for each particular application, but it should not be considered that the implementation goes beyond the scope of this application.

When functions are implemented in the form of software and sold or used as an independent product, the functions may be stored in a computer-readable storage medium. In this case, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, or a network device) to perform all or some of the steps of the methods according to the embodiments of this application. The foregoing storage medium includes: any medium that can store program code, such as a USB flash drive, a removable hard disk, a read-only memory (read-only memory, ROM), a random access memory (random access memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A Polar code rate matching method, comprising:
determining indexes of Z polarized channels on which forced frozen bits are placed, wherein the Z polarized channels are a subset of N polarized channels corresponding to N to-be-encoded bits, wherein $N=2^n$, wherein Z<N, and wherein n and Z are positive integers;
obtaining reliability of channels other than the Z polarized channels;
selecting, from the channels other than the Z polarized channels, K channels with a highest reliability to carry information bits, wherein remaining channels other than the K channels are used to carry frozen bits;
obtaining a first codeword with a length of N, wherein the first codeword is obtained by performing Polar coding on the N to-be-encoded bits;
performing rate matching on the first codeword to obtain a second codeword with a length of M, wherein M<N, and wherein M is a positive integer; and
sending the second codeword with a length of M.

2. The method according to claim 1, wherein indexes of polarized channels corresponding to the second codeword comprise indexes of the channels other than the Z polarized channels.

3. The method according to claim 1, wherein the performing rate matching on the first codeword comprises:
determining at least one second index set based on the indexes of Z polarized channels, wherein each second index set comprises a determined index of a punctured location or a shortened location in the first codeword; and
performing rate matching on the first codeword based on any second index set of the at least one second index set.

4. The method according to claim 3, wherein the determining at least one second index set based on the indexes of Z polarized channels comprises:
reading, from N indexes corresponding to the first codeword, indexes of the Z polarized channels to obtain one second index set.

5. The method according to claim 3, wherein the determining at least one second index set based on the indexes of Z polarized channels comprises:
determining a first bit sequence based on the indexes of Z polarized channels, wherein a length of the first bit sequence is equal to N;
performing bit exchange processing on the first bit sequence to obtain at least one second bit sequence, wherein the bit exchange processing is to exchange, in the first bit sequence, a bit placed at a location indicated by an $i^{th}$ index with a bit placed at a location indicated by an $(N/2+i)^{th}$ index, wherein i traverses $\{0, 1, \ldots, N/2-1\}$, and wherein the at least one second bit sequence is different from each other; and
reading, from each second bit sequence of the at least one second bit sequence, an index of a location at which a bit 0 is placed to obtain the at least one second index set, wherein each second bit sequence corresponds to one second index set.

6. The method according to claim 5, wherein an index of a location, in the first bit sequence, at which a bit 0 is placed is the same as an index of the Z polarized channels.

7. The method according to claim 5, wherein the determining a first bit sequence based on the indexes of Z polarized channels comprises:
determining a third bit sequence based on the indexes of Z polarized channels, wherein an index of a location, in the third bit sequence, at which a bit 0 is placed is the same as an index of the Z polarized channels; and
inverting the third bit sequence to obtain the first bit sequence.

8. The method according to claim 3, wherein the performing rate matching on the first codeword based on any second index set of the at least one second index set comprises:
using a location indicated, in the first codeword, by an index in the any second index set, as the shortened location or the punctured location of the first codeword, and
performing rate matching on the first codeword.

9. A Polar code rate matching device, comprising:
at least one processor;
one or more memories coupled to the at least one processor and storing programming instructions for execution by the at least one processor to:
determine indexes of Z polarized channels on which forced frozen bits are placed, wherein the Z polarized channels are a subset of N polarized channels corresponding to N to-be-encoded bits, wherein $N=2^n$, wherein Z<N, and wherein n and Z are positive integers;
obtain reliability of channels other than the Z polarized channels;
select, from the channels other than the Z polarized channels, K channels with a highest reliability to carry information bits, wherein remaining channels other than the K channels are used to carry frozen bits;
obtain a first codeword with a length of N, wherein the first codeword is obtained by performing Polar coding on the N to-be-encoded bits; and
perform rate matching on the first codeword to obtain a second codeword with a length of M, wherein M<N, and wherein M is a positive integer; and
a transceiver, configured to send the second codeword with a length of M.

10. The device according to claim 9, wherein indexes of polarized channels corresponding to the second codeword comprise indexes of the channels other than the Z polarized channels.

11. The device according to claim 9, wherein the one or more memories store the programming instructions for execution by the at least one processor further to:
determine at least one second index set based on the indexes of Z polarized channels, wherein each second index set comprises a determined index of a punctured location or a shortened location in the first codeword; and perform rate matching on the first codeword based on any second index set of the at least one second index set.

12. The device according to claim 11, wherein one or more memories store the programming instructions for execution by the at least one processor further to:

read, from N indexes corresponding to the first codeword, an index the same as an index of the Z polarized channels to obtain one second index set.

13. The device according to claim 11, wherein the one or more memories store the programming instructions for execution by the at least one processor further to:

determine a first bit sequence based on the indexes of Z polarized channels, wherein a length of the first bit sequence is equal to N;

perform bit exchange processing on the first bit sequence to obtain at least one second bit sequence, wherein the bit exchange processing is to exchange, in the first bit sequence, a bit placed at a location indicated by an $i^{th}$ index with a bit placed at a location indicated by an $(N/2+i)^{th}$ index, wherein i traverses $\{0, 1, \ldots, N/2-1\}$, and wherein the at least one second bit sequence is different from each other; and read, from each second bit sequence of the at least one second bit sequence, an index of a location at which a bit 0 is placed to obtain the at least one second index set, wherein each second bit sequence corresponds to one second index set.

14. The device according to claim 13, wherein an index of a location, in the first bit sequence, at which a bit 0 is placed is the same as an index of the Z polarized channels.

15. The device according to claim 13, wherein the determining a first bit sequence based on the indexes of Z polarized channels comprises:

determine a third bit sequence based on the indexes of Z polarized channels, wherein an index of a location, in the third bit sequence, at which a bit 0 is placed is the same as an index of the Z polarized channels; and invert the third bit sequence to obtain the first bit sequence.

16. The device according to claim 11, wherein the one or more memories store the programming instructions for execution by the at least one processor further to:

use a location indicated, in the first codeword, by an index in any second index set, as the shortened location or the punctured location of the first codeword, and perform rate matching on the first codeword.

17. A non-transitory computer-readable storage medium, wherein the non-transitory computer-readable storage medium stores a computer program for execution by a computer to:

determine indexes of Z polarized channels on which forced frozen bits are placed, wherein the Z polarized channels are a subset of N polarized channels corresponding to N to-be-encoded bits, wherein $N=2^n$, wherein Z<N, and wherein n and Z are positive integers;

obtaining reliability of channels other than the Z polarized channels;

selecting, from the channels other than the Z polarized channels, K channels with a highest reliability to carry information bits, wherein remaining channels other than the K channel are used to carry frozen bits;

obtaining a first codeword with a length of N, wherein the first codeword is obtained by performing Polar coding on the N to-be-encoded bits;

performing rate matching on the first codeword to obtain a second codeword with a length of M, wherein M<N, and wherein M is a positive integer; and sending the second codeword with a length of M.

18. The non-transitory computer-readable storage medium according to claim 17, wherein indexes of polarized channels corresponding to the second codeword comprise indexes of the channels other than the Z polarized channels.

19. The non-transitory computer-readable storage medium according to claim 17, wherein the performing rate matching on the first codeword comprises:

determining at least one second index set based on the indexes of Z polarized channels, wherein each second index set comprises a determined index of a punctured location or a shortened location in the first codeword; and performing rate matching on the first codeword based on any second index set of the at least one second index set.

20. The non-transitory computer-readable storage medium according to claim 19, wherein the determining at least one second index set based on the indexes of Z polarized channels comprises:

reading, from N indexes corresponding to the first codeword, indexes of the Z polarized channels to obtain one second index set.

* * * * *